US009536816B2

(12) United States Patent
Kessler et al.

(10) Patent No.: US 9,536,816 B2
(45) Date of Patent: Jan. 3, 2017

(54) ENCAPSULATED ELECTRONIC CHIP DEVICE WITH MOUNTING PROVISION AND EXTERNALLY ACCESSIBLE ELECTRIC CONNECTION STRUCTURE (71) Applicant: Infineon Technologies AG, Neubiberg (DE)

(72) Inventors: Angela Kessler, Sinzing (DE); Eduard Knauer, Regensburg (DE); Rudolf Lehner, Laaber (DE); Wolfgang Schober, Amberg (DE); Sigrid Schultes, Maxhuette-Haidhof (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/815,367

(22) Filed: Jul. 31, 2015

(65) Prior Publication Data
US 2016/0035658 A1 Feb. 4, 2016

(30) Foreign Application Priority Data

Aug. 1, 2014 (DE) .................. 10 2014 110 967

(51) Int. Cl.
*H01L 21/48* (2006.01)
*H01L 23/31* (2006.01)
(Continued)

(52) U.S. Cl.
CPC ..... *H01L 23/49811* (2013.01); *H01L 21/4853* (2013.01); *H01L 21/563* (2013.01); *H01L 21/565* (2013.01); *H01L 23/3121* (2013.01); *H01L 23/3157* (2013.01); *H01L 23/36* (2013.01); *H01L 23/3735* (2013.01);
(Continued)

(58) Field of Classification Search
CPC ...... H01L 23/34; H01L 23/36; H01L 23/3672; H01L 23/47; H01L 23/4006; H01L 23/492; H01L 23/49827; H01L 23/49811; H01L 21/565; H01L 21/4853; H01L 23/3121; H01L 23/3157; H01L 21/563; H01L 23/39827; H01L 23/49844; H01L 23/3735; H01L 2924/181; H01L 2224/32225; H01L 2924/00012
See application file for complete search history.

(56) References Cited

U.S. PATENT DOCUMENTS

| 8,299,601 | B2 * | 10/2012 | Oka | H01L 21/565 |
| | | | | 257/150 |
| 2010/0127389 | A1 * | 5/2010 | Obiraki | H01L 23/142 |
| | | | | 257/712 |
| 2015/0115288 | A1 * | 4/2015 | Tamada | H01L 23/3107 |
| | | | | 257/77 |

FOREIGN PATENT DOCUMENTS

EP 0959494 A1 11/1999

OTHER PUBLICATIONS

Examination report for corresponding German application DE 19 2014 110 967.8.

\* cited by examiner

*Primary Examiner* — Jasmine Clark (57) ABSTRACT

An electronic device comprising a carrier having a mounting surface, at least one electronic chip mounted on the mounting surface, at least one electric connection structure mounted on the mounting surface, an encapsulant at least partially encapsulating the carrier and the at least one electronic chip, and partially encapsulating the at least one electric connection structure so that part of a surface of the at least one electric connection structure is exposed to an
(Continued)

environment, and a mounting provision configured for mounting the electronic device at a periphery device.

19 Claims, 5 Drawing Sheets

(51) Int. Cl.
*H01L 23/492* (2006.01)
*H01L 23/498* (2006.01)
*H01L 21/56* (2006.01)
*H01L 23/36* (2006.01)
*H01L 23/373* (2006.01)
*H01L 23/40* (2006.01)

(52) U.S. Cl.
CPC ........ *H01L 23/4006* (2013.01); *H01L 23/492* (2013.01); *H01L 23/49827* (2013.01); *H01L 23/49844* (2013.01); *H01L 2224/32225* (2013.01); *H01L 2924/181* (2013.01)

ENCAPSULATED ELECTRONIC CHIP DEVICE WITH MOUNTING PROVISION AND EXTERNALLY ACCESSIBLE ELECTRIC CONNECTION STRUCTURE

BACKGROUND

Technical Field

Various embodiments relate generally to an electronic device, an electronic arrangement and a method of manufacturing an electronic device.

Description of the Related Art

Packages may be denoted as encapsulated electronic chips with leads extending out of the encapsulant and being mounted to an electronic periphery, for instance on a carrier such as a printed circuit board.

However, there is still potentially room to improve handling of electronic devices having embedded one or more chips while maintaining manufacturability simple.

SUMMARY

There may be a need to provide a possibility to manufacture electronic devices which are simple in handling for a user and which can be manufactured with reasonable effort.

According to an exemplary embodiment, an electronic device is provided, wherein the device comprises a carrier having a mounting surface, at least one electronic chip mounted on the mounting surface, at least one electric connection structure mounted on the mounting surface, an encapsulant at least partially encapsulating the carrier and the at least one electronic chip, and partially encapsulating the at least one electric connection structure so that part of a surface of the at least one electric connection structure is exposed to an environment, and a mounting provision configured for mounting the electronic device at a periphery device.

According to another exemplary embodiment, an electronic arrangement is provided, wherein the arrangement comprises an electronic device having the above-mentioned features, and the periphery device at which the electronic device is mounted or mountable by the mounting provision.

According to yet another exemplary embodiment, a method of manufacturing an electronic device is provided, wherein the method comprises mounting at least one electronic chip on a mounting surface of a carrier, mounting at least one electric connection structure on the mounting surface, at least partially encapsulating the carrier and the at least one electronic chip, and partially encapsulating the at least one electric connection structure by an encapsulant so that part of a surface of the at least one electric connection structure is exposed to an environment, and forming a mounting provision configured for mounting the electronic device at a periphery device.

An exemplary embodiment has the advantage that an encapsulated electronic chip on a mounting surface of a carrier and being preferably electrically coupleable via an electric connection structure to an electronic periphery device can be simply and securely assembled on a periphery device via a mounting provision forming an integral part of the electronic device. By taking this measure, a compact, simple and cheaply manufacturable electronic device is provided which at the same time can be handled easily by a user when assembling the electronic device on a periphery device. Thus, a very flexible and simple assembly of the electronic device with a periphery device is enabled on a user side.

DESCRIPTION OF FURTHER EXEMPLARY EMBODIMENTS

In the following, further exemplary embodiments of the method, the device and the arrangement will be explained.

A gist of an exemplary embodiment is to provide an electronic device having a mounting provision for accomplishing a reversible (for instance screw or clamp) connection of a molded semiconductor chip member (as encapsulated electronic chip) with the opportunity of a flexible positioning of one or more connection contacts (as electric connection structure, for instance an array of leads). A corresponding technology is particularly advantageous in terms of high throughput mass production. This allows for a simple assembly of electronic devices and corresponding periphery devices on a customer side.

In an embodiment, the mounting provision is exclusively defined or delimited by the material of the encapsulant. In such an embodiment, the material of the encapsulant alone forms and delimits the mounting provision at which a mounting structure can be arranged for accomplishing the mounting. Thus, the mounting provision may form an integral part of the encapsulant without the need to adapt further components of the electronic device (such as the carrier) and without the need to provide separate member for constituting the mounting provision. This results in a compact and lightweight electronic device without compromising on the freedom to mount the electronic device on a periphery device. For example, a through hole may be formed extending through the encapsulant and being configured for accommodating a mounting structure, such as a screw. For instance, the wall of such a through hole may be adapted to match to the screw, for example may be provided with a corresponding thread. However, such a wall may be smooth. Alternatively, a blind hole may be formed extending into the encapsulant and being configured for accommodating a mounting structure, such as a clamping bolt.

In an embodiment, the mounting provision is at least partially defined by a separate reinforcement body (for instance is exclusively defined and delimited by the reinforcement body, or is defined and delimited partially by the reinforcement body and partially by the encapsulant). In such a highly preferred embodiment, a separate reinforcement body may accomplish the mounting of the electronic device at the periphery device. Such an embodiment has the advantage that the properties of the reinforcement body may be specifically adjusted in terms of the desired mounting capability. In particular, a mounting strength may be significantly improved by taking this measure. For instance, a mechanical load acting on the (for instance brittle, soft or mechanically only moderately robust) encapsulant material in terms of mounting can be reduced by directing the mounting force flow into the reinforcement body. A hardness of a material of the reinforcement body (such as a metal) may be higher than a hardness of a material of the encapsulant to thereby reinforce the electronic device. By providing a reinforcement body, a mechanical reinforcement may be achieved by at least one accurately fitting inlay body. Potential mechanical weak points resulting from a direct force transmitting contact between the (for instance plastic) encapsulant and a mounting structure (such as a screw) can therefore be prevented.

In an embodiment, the reinforcement body is at least partially encapsulated within the encapsulant. Hence, the reinforcement body may be at least partially embedded within the encapsulant rendering the entire electronic device more robust. However, part of the surface of the reinforcement body may be still exposed to an environment of the electronic device to thereby form a contact surface of the mounting provision cooperating (for instance having direct physical contact) with a mounting structure. Encapsulating the reinforcement body partially into the encapsulant may be carried out in a simple way during the encapsulant procedure in which also the at least one electronic chip and the at least one electric connection structure are at least partially embedded in the encapsulant.

In an embodiment, the reinforcement body is mechanically connected to the carrier (for instance is mechanically anchored or fixed to the carrier). In particular, the reinforcement body may be even electrically coupled with the carrier. Preferably, the reinforcement body is provided separately from the carrier so that the freedom of specifically designing the carrier for mounting one or more electronic chips and the at least one connection structure thereon is not influenced by the provision of the reinforcement body. However, it may be advantageous to mechanically couple the carrier with the reinforcement body to strengthen the entire mechanical integrity of the electronic device. By electrically coupling an electrically conductive carrier with an electrically conductive reinforcement body for short-circuiting them it is possible to prevent undesired electric voltages to be generated between these two bodies. It is for instance possible to couple the reinforcement body and/or the carrier to electric ground potential. When the mounting provision is formed independently of the carrier, a high mounting surface and chip density may be obtained. Furthermore, an improved disruptive strength may be obtained by separating the provision for the mechanical mounting on the one hand and the carrier with the electronic components mounted thereon on the other hand.

In an embodiment, the reinforcement body is configured as a sleeve such as a tubular body (for instance made of metal). A mounting structure such as a screw or a bolt or a clamp or a clip can then be guided through the through hole of the sleeve for accomplishing the mounting. For example, an external surface of a for instance hollow cylindrical sleeve may be in direct contact with and may be surrounded by material of the encapsulated, whereas an interior surface of the for instance hollow cylindrical sleeve may be exposed to the environment to be capable of contacting and cooperating with a mounting structure. Such a sleeve may be made of a metallic material.

In an embodiment, the reinforcement body is configured as a profile, in particular as one of the group consisting of an at least partially plate-shaped profile, an at least partially strut-shaped profile, and a frame having a through hole. Such a profile may comprise one or more flat or bent plates or an arrangement of plate sections connected to one another. Such a profile may additionally or alternatively comprise one or more flat or bent struts or bars or an arrangement of strut or bar sections connected to one another. A through hole extending through the profile may then form part of or may constitute the mounting provision. A surface portion of the profile may remain exposed to the environment so as to cooperate with a mounting structure such as a screw or bolt or clamp or clip. Another surface portion of the profile may be embedded within the encapsulant. Such a profile may be made of a metallic material.

In an embodiment, the reinforcement body is electrically grounded. By taking this measure, it can be prevented that an undesired electric voltage is generated between the reinforcement body and other grounded electrically conductive portions of the electronic device. This improves the operation safety of the electronic device.

In an embodiment, the mounting provision is configured for mounting the electronic device at the periphery device by one of clamping and screwing. Other reversible or irreversible connection mechanisms are possible as well. The mentioned mounting techniques allow for a simple handling of the electronic device and render it possible to flexibly assemble or disassemble the electronic device with regard to the periphery device.

In an embodiment, the mounting provision is configured for accommodating a mounting structure to thereby establish fixation between the electronic device and the periphery device. The mounting structure may form part of the electronic device and/or of the periphery device. Such a mounting structure can, for instance, be a screw, a bolt, a clamp or a clip. The mounting of the electronic device at the periphery device may be accomplished by a cooperation between the mounting structure and the mounting provision, for instance by the insertion and fastening of a screw as mounting structure at a threaded hole, the hole forming part of the electronic device or the periphery device.

In one embodiment, the mounting structure forms part of the electronic device. The mounting structure may be either permanently connected to one or more constituents of the electronic device, for instance to the encapsulant. Alternatively, the mounting structure may be provided separately from all remaining constituents of the electronic device, for instance may be a separate body. In yet another embodiment, the mounting structure may form part of the periphery device.

In an embodiment, the mounting provision is a through hole extending through the entire encapsulant in thickness direction, wherein at least part of the through hole is laterally delimited by the reinforcement body. This allows for a compact construction of the mounting provision which does not need to laterally extend beyond the encapsulant.

In an embodiment, the mounting provision is formed as a plurality of sub provisions, each configured for accomplishing the mounting of the electronic device on the periphery device, alone or in combination with at least one other of the sub provisions. For example, the sub provisions may be through holes on opposing sides of the electronic device allowing for a mounting at at least two positions to further improve stability.

In an embodiment, the mounting provision is configured as at least one through hole fully extending through the entire device in thickness direction. Alternatively, the mounting provision may be a blind hole (for instance delimited by a for example spring-loaded sleeve) or any other kind of indentation which can be connected to the periphery device by a clamping pin or the like to be inserted (for instance by applying a certain clamping pressure) into the blind hole.

In an embodiment, the carrier is provided separately from the mounting structure. In this embodiment, the mounting structure does not form part of the carrier. Hence, it is possible to keep the carrier completely unaffected and uninfluenced by the mounting procedure so that the entire carrier may be used for carrying electronic chips, electric connection structures, other electronic members and/or structures, etc.

In an embodiment, the carrier has an exposed surface opposing the mounting surface and forming an external surface portion of the electronic device. The exposed surface and the mounting surface may form two opposing main surfaces of the (for instance plate-shaped) carrier. By extending out of the encapsulant, the carrier being in contact with the at least one electronic chip may also contribute to heat removal of ohmic heat generated during operation of the electronic device. Hence, one main surface of the electronic device may be formed by a main surface of the carrier.

Alternatively, the entire carrier may be fully encapsulated in an interior of the encapsulant. This may mechanically protect the carrier against damage, for example in a scenario in which heat removal is not an issue.

In an embodiment, the encapsulant may be an electrically insulating material or dielectric material. For instance, such an encapsulant may be a mold compound or a silicone casting or a polyimide-based spray coating. The encapsulant may be made of a thermosetting material or a thermoplastic material. The encapsulant may be formed by transfer molding, injection molding, etc. The encapsulant may also be a laminate or a foil stack (for instance of a polymer material). For the packaging, moulding or encapsulant, a plastic material or a ceramic material may be used.

In an embodiment, a free end of the at least one electric connection structure is in flush with an exposed surface portion of the encapsulant. This ensures a compact construction of the device and nevertheless enables it to get external electric access to the at least one electronic chip. However, a free end of the at least one electric connection structure (for instance one or more leads) may alternatively protrude beyond an exposed surface portion of the encapsulant.

In an embodiment, each of the at least one electric connection structure comprises an electrically conductive sleeve having a recess configured for accommodating a respective electrically conductive pin. Each of multiple pins may be connected to a respective one of the sleeves by a clamp connection, a press fit connection, a solder connection, or the like. In an embodiment, the pins extend beyond an upper main surface of the electronic device (which may be shaped as a flat device). Both the arrangement of the sleeves (at least partially in an interior of the encapsulant) and the pins on the carrier can be flexibly selected by a user in accordance with a desired application.

In an embodiment, the recess extends substantially perpendicular to the carrier configured as a plate. Accordingly, the pins may have a straight shape and may also extend perpendicular to a main surface of the electronic device.

In an embodiment, the device further comprises the at least one electrically conductive pin each accommodated or to be accommodated in a respective one of the at least one recess. In the described embodiment, the pin may be already located inside the sleeve, for instance fixed there by press fitting. Alternatively, it is possible that the electronic device is provided only with the sleeves, without the pins, which can then be mounted on a user side in accordance with a desired electronic application.

In an embodiment, the carrier comprises an electrically insulating base plate and an electrically conductive structure, in particular a patterned electrically conductive layer, at least partially defining the mounting surface. The electrically insulating base plate may electrically decouple two electrically conductive structures on opposing main surfaces thereof. One electrically conductive structure on a main surface of the electrically insulating base plate and encapsulated by the encapsulant may be provided for electrically coupling the one or more electronic chips to the one or more electric connection structures and/or to one another. Another electrically conductive structure on a main surface of the electrically insulating base plate being exposed to the environment and thereby forming an outer surface of the carrier may serve for removing heat generated in an interior of the electronic device during operation towards an environment, to thereby prevent overheating of the electronic components within an interior of the electronic device. In particular, the electrically insulating base plate may be also made of a thermally conductive material (for instance having a thermal conductivity of more than 10 W/mK).

In an embodiment, the carrier comprises an electrically insulating (and preferably thermally conductive) core and an electrically conductive structure thereon and/or therein. In particular, the carrier may be configured as one of the group consisting of a Direct Copper Bonding (DCB) substrate, and a Direct Aluminum Bonding (DAB) substrate. DCB and DAB substrates allow for a cost efficient solution of the mounting and cooling issues. However, the carrier may also comprise a leadframe.

The one or more electronic chips may be semiconductor chips, in particular dies. In an embodiment, the at least one electronic chip is configured as a power semiconductor chip, in particular comprising at least one of the group consisting of a diode, and a transistor, more particularly an insulated gate bipolar transistor. In an embodiment, the device is configured as a power module. For instance, the one or more electronic chips may be used as semiconductor chips for power applications for instance in the automotive field. In an embodiment, at least one electronic chip may comprise a logic IC or an electronic chip for RF power applications. In one embodiment, the electronic chip(s) may be used as one or more sensors or actuators in microelectromechanical systems (MEMS), for example as pressure sensors or acceleration sensors.

In one embodiment, only one main surface of the electronic device is mounted to a periphery device by the correspondingly configured mounting provision. In another embodiment, each of two opposing main surfaces of the electronic device is mounted to a respective periphery device by the correspondingly configured mounting provision.

In an embodiment, the periphery device comprises a cooling structure, in particular a cooling plate, wherein the electronic device is mounted or mountable on the cooling structure by the mounting provision. Alternatively, the periphery device may comprise an electronic mounting base having an electrically insulating support and an electrically conductive structure thereon and/or therein, in particular one of the group consisting of a Direct Copper Bonding substrate, a Direct Aluminum Bonding substrate, and a printed circuit board. However, the periphery device may also comprise a leadframe.

In an embodiment, the mounting provision is formed during the procedure of encapsulating, in particular during encapsulating by molding, more particularly during encapsulating by transfer molding. This allows to manufacture the electronic device in an efficient way.

As substrate or wafer for the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

The illustration in the drawing is schematically and not to scale.

Figure 1:
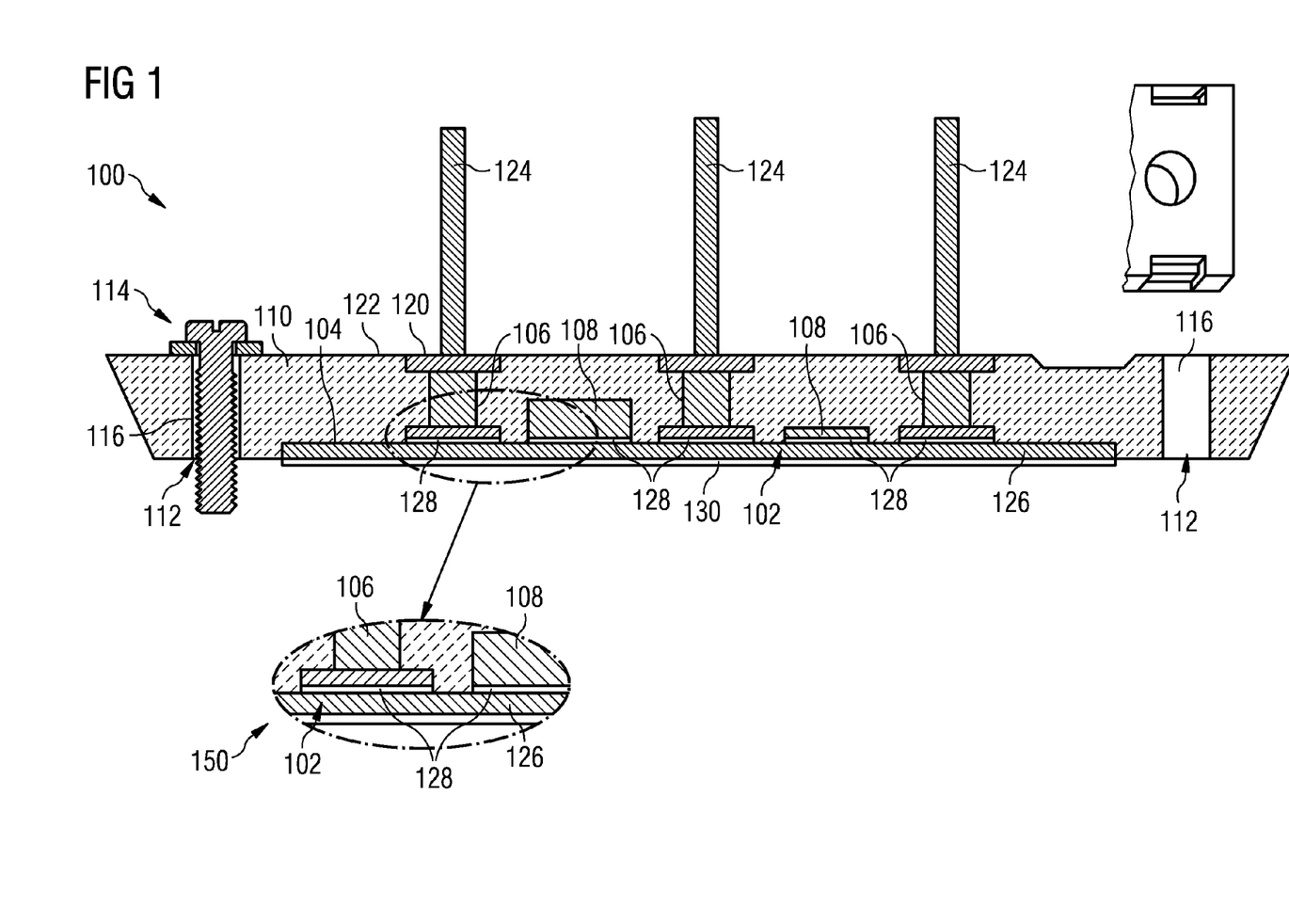
FIG. 1 shows a cross-sectional view of an electronic device according to an exemplary embodiment.

FIG. 1 shows a cross-sectional view of an electronic device 100 according to an exemplary embodiment.

The electronic device 100 is configured as a package and serves as a power module for semiconductor power applications. The electronic device 100 shown in FIG. 1 comprises a carrier 102 having a mounting surface 104 and being embodied as a Direct Copper Bonding (DCB) substrate. This means that the carrier 102 comprises a central base plate 126 having electrically insulating and thermally conductive properties, for instance made of a ceramic material or the like. On both opposing main surfaces of the central base plate 126, a respective electrically conductive structure 128, 130 made of copper is provided. Electrically conductive structure 128 is a patterned layer, whereas electrically conductive structure 130 is a continuous layer. Electrically conductive structure 128 serves as an electric mounting base for mounting electronic members as described in the following. Electrically conductive structure 130 is also thermally conductive and serves for removing heat generated during operation of the electronic device 100.

Electronic chips 108, which are here embodied as semiconductor power chips (for instance comprising one or more transistors, such as IGBTs, and one or more diodes), are mounted on the mounting surface 104 of the carrier 102, more precisely on respective portions of the electrically conductive structure 128 of the carrier 102 (see detail 150 of FIG. 1).

A plurality of electric connection structures 106, here configured as sleeve and pin contacts as will be described below in more detail, or mounted on the mounting surface 104 as well, more precisely on respective portions of the electrically conductive structure 128 of the carrier 102 (see detail 150 of FIG. 1). Hence, pads of the electronic chips 108 may be electrically coupled to one another and/or to respective ones of the electric connection structures 106 via sections of the electrically conductive structure 128.

An encapsulant 110, for instance a mold compound of plastic material, encapsulates a subsection of the carrier 102 and fully encapsulates the electronic chips 108. Moreover, the encapsulant 110 encapsulates a subsection of the electric connection structures 106. Consequently, part of a surface of the electric connection structures 106 is exposed to an environment to be accessible for establishing an electric connection to another electronic member, whereas another part of the surface of the electric connection structures 106 is embedded within the encapsulant 110.

A mounting provision 112, which is in the described embodiment constituted by two separate sub provisions (shown on the left-hand side of FIG. 1 and on the right-hand side of FIG. 1) is configured for mounting the electronic device 100 at a periphery device (not shown in FIG. 1, compare for instance FIG. 9), such as a cooling plate, a printed circuit board, a casing, etc. In the embodiment shown in FIG. 1, the mounting provision 112 is exclusively defined by the encapsulant 110. Thus, a surrounding wall of the material of the encapsulant 110 which wall delimits a through hole 116 extending through the entire thickness direction of the encapsulant 110 constitutes the mounting provision 112 which therefore is provided separately from the carrier 102 and does not require any additional hardware effort. When a respective screw as respective mounting structure 114 is guided through the respective through hole 116 of the mounting provision 112 and is fastened at the periphery device by screwing, the electronic device 100 is securely mounted on the periphery device. In other words, the mounting provision 112 is configured for accommodating mounting structures 114 to thereby establish fixation between the electronic device 100 and the periphery device. Thus, assembly of the electronic device 100 (by making use of the mounting structures 114) on a periphery device may be flexibly performed by a user at a customer side without the need of additional elements, thereby allowing to achieve a compact construction and an intimate and secure connection.

As can be taken from FIG. 1, the carrier 102 has an exposed surface 118 outside of the encapsulant 110 opposing the mounting surface 104 and forming an external surface portion of the electronic device 100. Thus, heat can be conducted away from the electronic chips 108 (configured as power chips) during operation of the electronic device 100 via the highly thermally conductive components of the carrier 102.

Coming back to the electric connection structures 106, a free end 120 of them is in flush with an exposed surface portion 122 of the encapsulant 110. This allows to obtain a flat configuration of the electronic device 100. The electric connection structures 106 are configured as electrically conductive sleeves having a recess (not shown in FIG. 1, compare FIG. 2) configured for accommodating a respective one of a number of electrically conductive pins 124. The sleeves have a radially narrow axially central portion integrally formed with or juxtaposed to two opposing radially widened axial end portions. The pins 124 may be inserted into the sleeve-shaped electric connection structures 106, and may be fixed in the sleeves by press fitting or the like (this can be carried out at a factory side or at a user side). Both the pins 124 and the recesses extend perpendicular to the plate-shaped carrier 102 and extend perpendicular to an upper main surface of the encapsulant 110.

Figure 2:
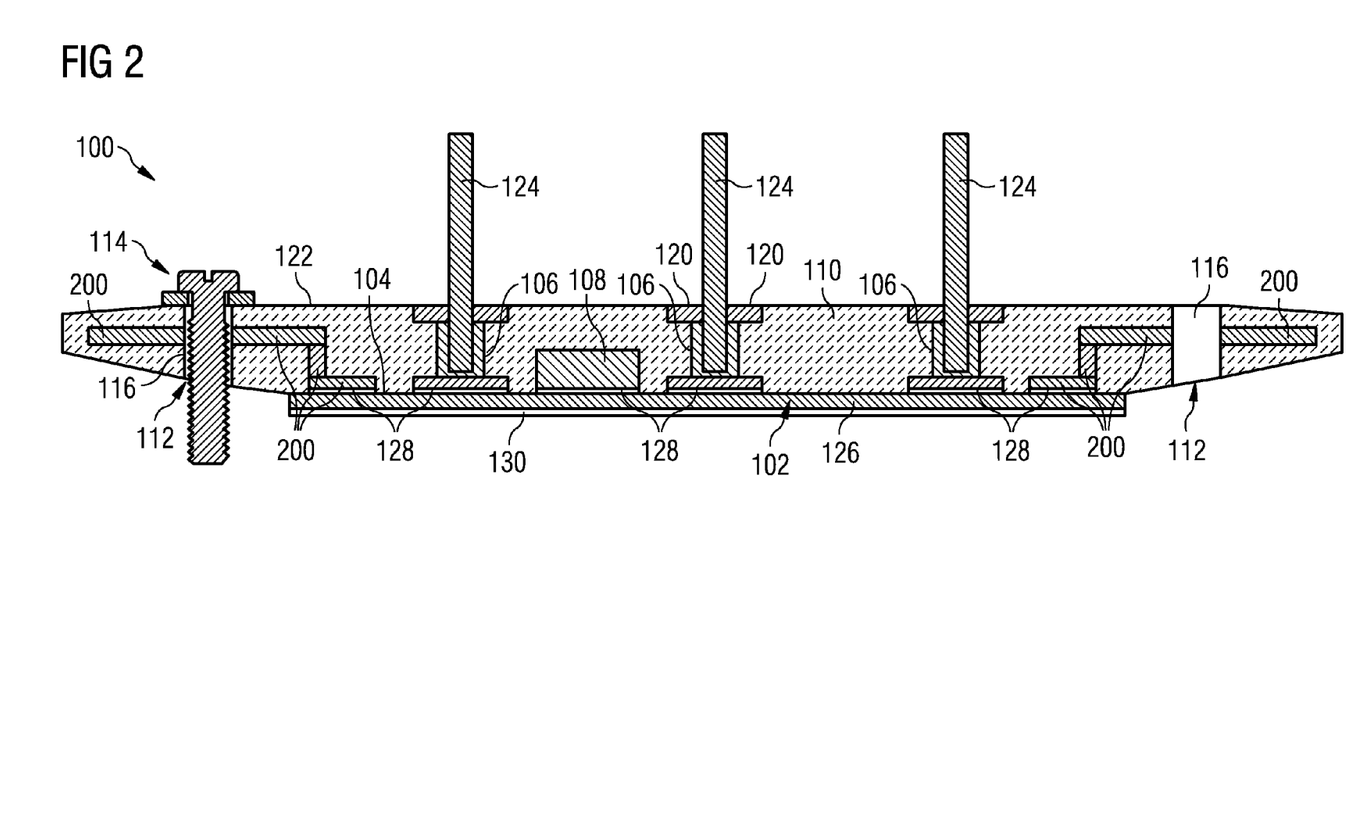
FIG. 2 shows a cross-sectional view of an electronic device according to another exemplary embodiment.

FIG. 2 shows a cross-sectional view of an electronic device 100 according to another exemplary embodiment.

In the embodiment of FIG. 2, the mounting provision 112 is partially defined by a separate reinforcement body 200, and is partially defined by the encapsulant 110. Through holes 116 respectively extend through the entire encapsulant 110 in which the reinforcement body 200 is encapsulated. Thus, the walls delimiting the through holes 116 are partly formed or defined by exposed material of the encapsulant 110 and are partly formed or defined by exposed material of the reinforcement body 200. In the embodiment of FIG. 2, the reinforcement body 200 is configured as a profile shaped as a metal frame having through holes contributing to the mounting provision 112 and forming part of the through holes 116. In the shown embodiment, the reinforcement body 200 is mechanically connected and electrically coupled to the carrier 102, more precisely to the electrically conductive structure 128 thereof. This mechanical and electric connection may be accomplished by soldering the reinforcement body 200 onto the electrically conductive structure 128 of the carrier 102. In particular, the reinforcement body 200 as an inlay in the encapsulant 110 may be electrically grounded. This may prevent undesired generation of a high electric potential at the reinforcement bodies 200.

The embodiment of FIG. 2 has the significant advantage that, upon fastening the electronic device 100 to a periphery device (not shown) via mounting structures 114 such as screws, mounting forces and corresponding mechanical load can be received to a large degree by the metallic reinforcement body 200 rather than by the sometimes brittle and only moderately robust encapsulant 110. This may prevent damage of the for instance brittle material of the encapsulant 110. Thus, the configuration of the mounting provision 112 according to FIG. 2 stabilizes the electronic device 100 while preventing the danger of breakout of material of the encapsulant 110.

Thus, in the embodiment of FIG. 2, a soldered metal profile provided with bores is partially embedded by mold material to form part of a screw connection provision. Alternatively, it is also possible that a reinforcement body 200 of another embodiment is not encapsulated at all by material of the encapsulant 110, but is connected to the other components of the electronic device 100 in another way than by molding. As a further alternative to FIG. 2, it is possible that the reinforcement body 200 is not connected to the carrier 102, in particular is not connected by soldering thereto. For instance, the reinforcement body 200 may be electrically insulated from the carrier 102, for example may be fully embedded within the electrically insulating material of the encapsulant 110.

FIG. 2 specifically shows how the sleeve shaped electric connection structures 106 are filled by the pins 124 and are connected to them by press fitting.

Figure 3:
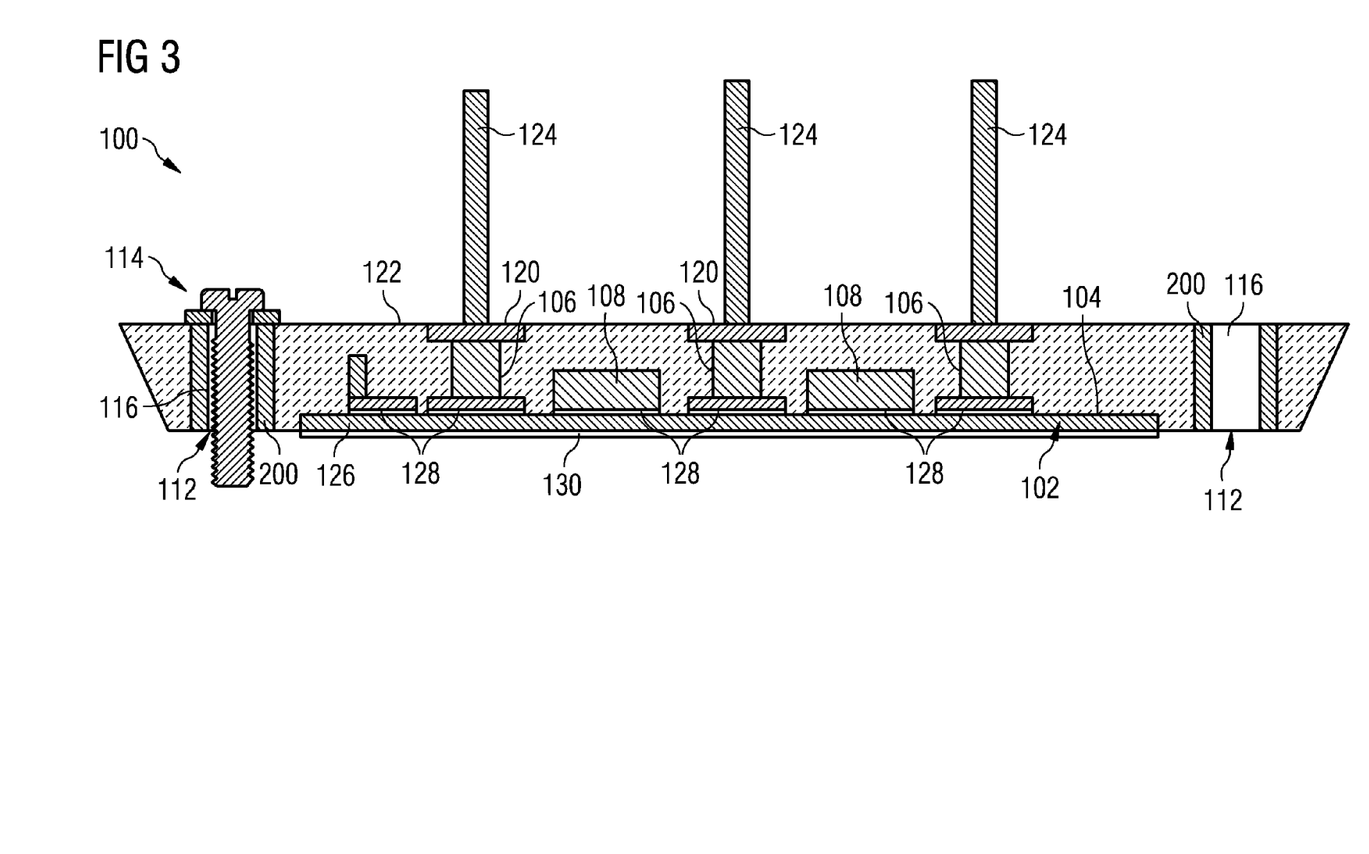
FIG. 3 shows a cross-sectional view of an electronic device according to yet another exemplary embodiment.

FIG. 3 shows a cross-sectional view of an electronic device 100 according to yet another exemplary embodiment.

According to FIG. 3, two reinforcement bodies 200 configured as metallic sleeves are integrated within the encapsulant 110. In the embodiment of FIG. 3, the entire mounting provision 112 is circumferentially delimited by material of the reinforcement bodies 200 so that the mechanically less stable plastic material of the encapsulant 110 is prevented from mechanical damage during mounting. The respective mounting structures 114, embodied again as screws, are guided through the through holes 116 defined by the metal inlay sleeves and are screwed into correspondingly formed screw holes (having threads) in an interior of the periphery device. The mold embedded sleeves constituting the mounting provision 112 are in flush with the surrounding material of the encapsulant 110 both at an upper main surface and at a lower main surface of the electronic device 100, thereby contributing to the compactness of the electronic device 100.

Figure 4:
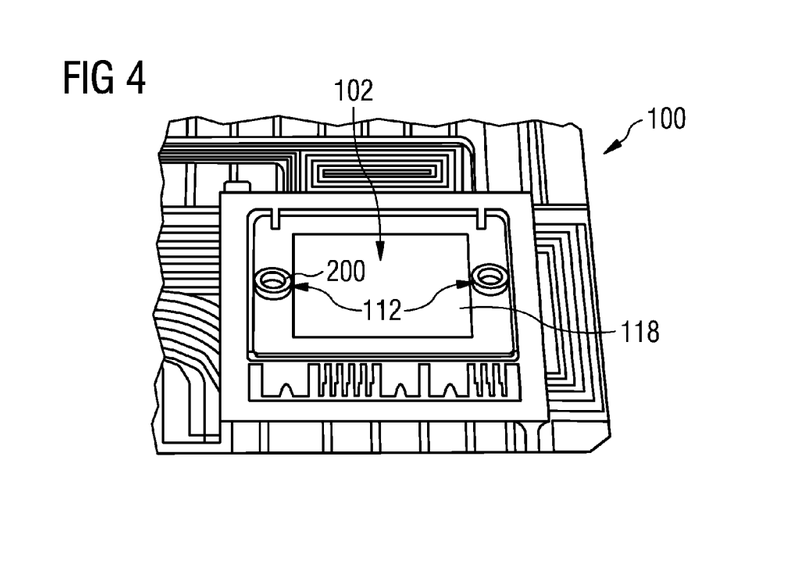
FIG. 4 shows a plan view of an electronic device according to an exemplary embodiment.

FIG. 4 shows a plan view of an electronic device 100 according to an exemplary embodiment. FIG. 4 shows particularly the metal inlays constituting the mounting provision 112 before molding, i.e. before forming encapsulant 110.

Figure 5:
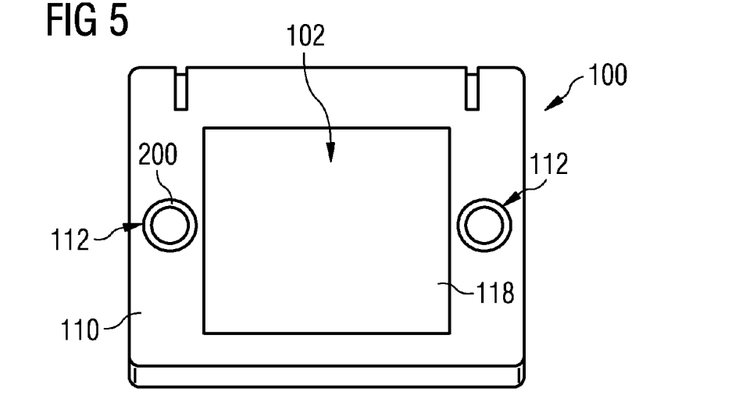
FIG. 5 shows a plan view of an electronic device according to another exemplary embodiment.

FIG. 5 shows an electronic device 100 according to another exemplary embodiment. Here, the mounting provision 112 is configured as blind holes formed in reinforcement bodies 200 molded within encapsulant 110. These mounting provisions 112 are suitable for being clamp-connected with clamps (not shown) of a periphery device. According to FIG. 5, the mounting provision 112 is formed by cup shaped metallic inlays to which counterparts as mounting structures (not shown) can be inserted and fixed by clamping.

Figure 6:
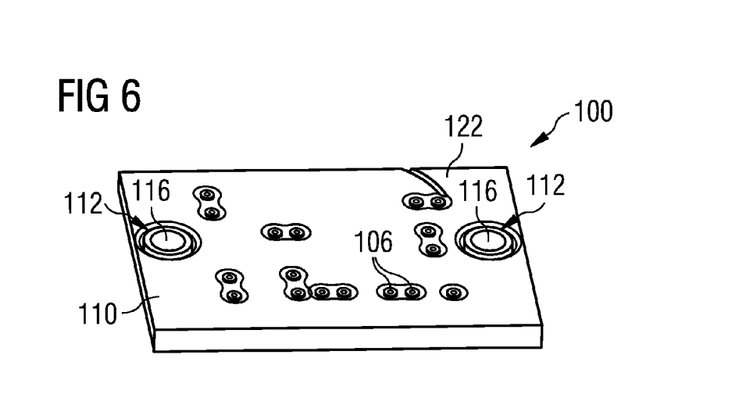
FIG. 6 shows a plan view of an electronic device according to yet another exemplary embodiment.

FIG. 6 shows a flat plate-shaped electronic device 100 according to yet another exemplary embodiment from a side on which a two-dimensional array of electric connection structures 106 is visible.

Figure 7:
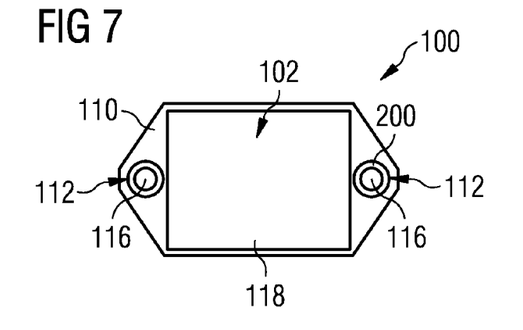
FIG. 7 shows a bottom view of an electronic device according to an exemplary embodiment.
Figure 8:
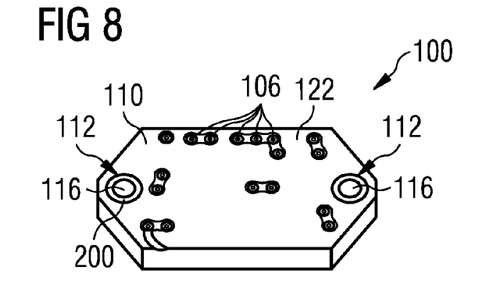
FIG. 8 shows a top view of the electronic device of FIG. 7.

FIG. 7 shows a bottom view of an electronic device 100 according to another exemplary embodiment from a top side. FIG. 8 shows a bottom view of the electronic device 100 of FIG. 7. The encapsulant 110 here tapers towards lateral sides of the electronic device 100, wherein the mounting provision 112 is formed at a respective narrow end section of the encapsulant 110. The electronic device 100 of FIG. 8 is very compact.

Figure 9:
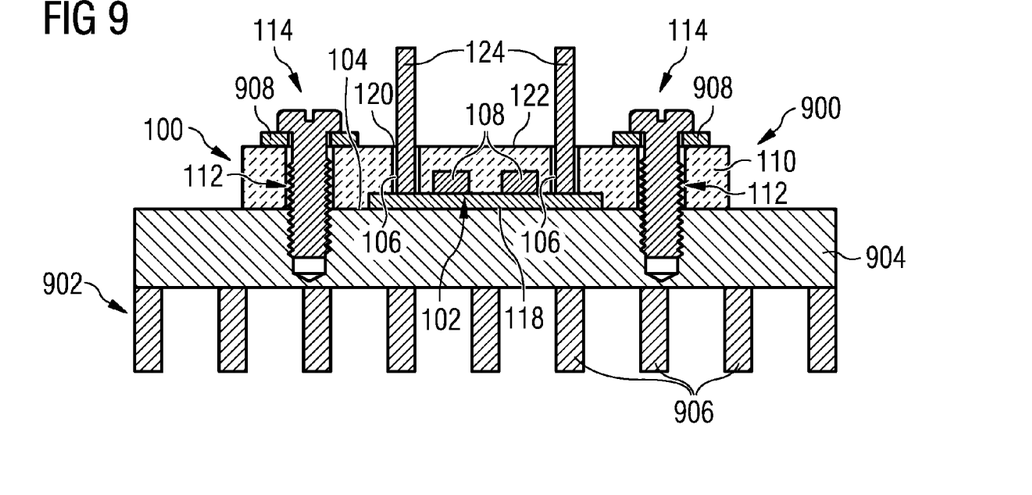
FIG. 9 shows a cross-sectional view of an electronic arrangement according to an exemplary embodiment.

FIG. 9 shows a cross-sectional view of an electronic arrangement 900 according to an exemplary embodiment.

The electronic arrangement 900 comprises an electronic device 100 having the above mentioned features and a periphery device 902 at which the electronic device 100 is mounted by the mounting provision 112 using mounting structures 114.

In the shown embodiment, the periphery device 902 comprises or consists of a thermally conductive cooling structure 904, more precisely a cooling plate. The electronic device 100 is mounted on the cooling structure 904 by the mounting provision 112 so as to mechanically connect the periphery device 902 to the electronic device 100 in a way so as to promote removal of heat generated during operation of the electronic device 100 via the cooling structure 904. Cooling fins 906 of the cooling structure 904 are shown as well. Washers 908 are provided between the mounting structures 904 (here screws) and the encapsulant 110 to further decrease the mechanical impact on the brittle encapsulant 110 per contact area.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, the device comprising:
a carrier having a mounting surface;
at least one electronic chip mounted on the mounting surface;
at least one electric connection structure mounted on the mounting surface;
an encapsulant at least partially encapsulating the carrier and the at least one electronic chip, and partially encapsulating the at least one electric connection structure so that part of a surface of the at least one electric connection structure is exposed to an environment;
a mounting provision configured for mounting the electronic device at a periphery device;
wherein the mounting provision extends at least partially through the encapsulant.

2. The device according to claim 1, wherein the mounting provision is exclusively defined by the encapsulant.

3. The device according to claim 1, wherein the mounting provision is at least partially, in particular exclusively, defined by a separate reinforcement body.

4. The device according to claim 3, wherein the reinforcement body is at least partially encapsulated within the encapsulant.

5. The device according to claim 3, wherein the reinforcement body is connected to the carrier, in particular is electrically coupled with the carrier.

6. The device according to claim 3, wherein the reinforcement body is configured as a sleeve.

7. The device according to claim 3, wherein the reinforcement body is configured as a profile, in particular as one of the group consisting of an at least partially plate-shaped profile, an at least partially strut-shaped profile, and a frame having a through hole.

8. The device according to claim 3, wherein the reinforcement body is electrically grounded.

9. The device according to claim 1, wherein the mounting provision is configured for mounting the electronic device at the periphery device by one of clamping and screwing.

10. The device according to claim 1, wherein the mounting provision is configured for accommodating a mounting structure, forming part of at least one of the device and the periphery device, to thereby establish fixation between the electronic device and the periphery device.

11. The device according to claim 1, wherein the mounting provision is configured as at least one through hole fully extending through the entire device in a thickness direction.

12. The device according to claim 10, wherein the carrier is provided separately from the mounting structure.

13. The device according to claim 1, wherein each of the at least one electric connection structure comprises an electrically conductive sleeve having a recess configured for accommodating a respective one of at least one electrically conductive pin.

14. The device according to claim 1, wherein the carrier comprises an electrically insulating base plate and an electrically conductive structure, in particular a patterned electrically conductive layer, at least partially defining the mounting surface.

15. The device according to claim 1, wherein the at least one electronic chip is configured as a power semiconductor chip, in particular comprising at least one of the group consisting of a diode, and a transistor, more particularly an insulated gate bipolar transistor.

16. An electronic arrangement, the arrangement comprising:
an electronic device according to claim 1;
the periphery device at which the electronic device is mounted or mountable by the mounting provision.

17. The arrangement according to claim 16, wherein the periphery device comprises one of the group consisting of:
a cooling structure, in particular a cooling plate, wherein the electronic device is mounted or mountable on the cooling structure by the mounting provision;
an electronic mounting base having an electrically insulating core and an electrically conductive structure thereon and/or therein, in particular one of the group consisting of a Direct Copper Bonding substrate, a Direct Aluminum Bonding substrate, and a printed circuit board.

18. A method of manufacturing an electronic device, the method comprising:
mounting at least one electronic chip on a mounting surface of a carrier;
mounting at least one electric connection structure on the mounting surface;
at least partially encapsulating the carrier and the at least one electronic chip, and partially encapsulating the at least one electric connection structure by an encapsulant so that part of a surface of the at least one electric connection structure is exposed to an environment;
forming a mounting provision configured for mounting the electronic device at a periphery device;
wherein the mounting provision extends at least partially through the encapsulant.

19. The method according to claim 18, wherein the mounting provision is formed during the encapsulating, in particular during encapsulating by molding, more particularly during encapsulating by transfer molding.

* * * * *